(12) United States Patent
Shen et al.

(10) Patent No.: US 6,627,971 B1
(45) Date of Patent: Sep. 30, 2003

(54) POLYSILICON STRUCTURES WITH DIFFERENT RESISTANCE VALUES FOR GATE ELECTRODES, RESISTORS, AND CAPACITOR PLATES

(75) Inventors: Chih-Heng Shen, Hsin-Chu (TW); Sen-Fu Chen, Taipei (TW); Huan-Wen Wang, Hsin-Chu (TW); Ying-Tzu Yen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 17 days.

(21) Appl. No.: 09/654,777

(22) Filed: Sep. 5, 2000

Related U.S. Application Data

(62) Division of application No. 09/073,950, filed on May 7, 1998, now Pat. No. 6,143,474.

(51) Int. Cl.[7] .......................... H01L 29/00; H01L 29/76; H01L 27/01; H01L 29/94
(52) U.S. Cl. .................. 257/538; 257/412; 257/350; 257/337; 257/532; 257/533; 257/536
(58) Field of Search .................. 257/408, 412, 257/538, 350, 337, 532, 533, 536

(56) References Cited

U.S. PATENT DOCUMENTS

| 4,643,777 A | 2/1987 | Maeda | 148/1.5 |
| 5,514,617 A | 5/1996 | Liu | 437/60 |
| 5,622,884 A | 4/1997 | Liu | 438/238 |
| 5,705,418 A | 1/1998 | Liu | 437/46 |

FOREIGN PATENT DOCUMENTS

| JP | 1-165156 | * 6/1989 | 257/538 |
| JP | 5-109983 | * 4/1993 | 257/533 |

* cited by examiner

*Primary Examiner*—Steven Loke
(74) *Attorney, Agent, or Firm*—George O. Saile; Stephen B. Ackerman; Graham S. Jones, II

(57) ABSTRACT

A device with a plurality of structures with different resistance values is formed on a substrate. A polysilicon layer is formed upon the substrate. A silicon oxide layer is formed over the substrate. A hard masking layer is formed over the silicon oxide layer. The hard masking layer includes a full thickness portion and a thinner portion. The polysilicon layer below the full thickness portion is lightly doped forming a high resistance region. Below the thinner portion the polysilicon layer is heavily doped forming a low resistance region. However, in spite of the differences in resistance, the high resistance region and the low resistance region have the same thickness.

21 Claims, 12 Drawing Sheets

POLYSILICON STRUCTURES WITH DIFFERENT RESISTANCE VALUES FOR GATE ELECTRODES, RESISTORS, AND CAPACITOR PLATES

This is a division of patent application Ser. No. 09/073,950, filing date May 7, 1998, now U.S. Pat. No. 6,143,474 Method Of Fabricating Polysilicon Structures With Different Resistance Values For Gate Electrodes, Resistors And Capacitor Plates And The Devices Produced Thereby, assigned to the same assignee as the present invention.

BACKGROUND OF THE INVENTION

1. Field of the Invention

This invention relates to integrated circuit devices and more particularly to the process of manufacture of polysilicon structures with varying values of resistance and the devices produced by the process.

2. Description of Related Art

U.S. Pat. No. 5,705,418 of Liu for "Process for Fabricating Reduced-Thickness High-Resistance Load Resistors in Four-Transistor SRAM Devices" shows a method of forming polysilicon resistors where an oxide layer is used as an Ion Implantation (I/I) block. An oxidation resistant layer is formed and patterned for exposing regions of the polysilicon layer designated for the formation of the load resistors. An oxide layer is formed over the surface of the exposed portions of the polysilicon layer, so that the thickness of the designated regions of the polysilicon layer below the oxide layer is reduced. These designated regions are provided to form load resistors. The oxidation resistant layer is then removed. Then, impurity ions are implanted into exposed regions of the polysilicon layer, not covered by the oxide layer, which are designated for forming interconnectors for the memory cell unit.

U.S. Pat. No. 5,514,617 of Liu for "Method of Making a Variable Resistance Polysilicon Conductor for SRAM Devices" shows how to produce resistors using a patterning method with an I/I (Ion Implantation) process with step areas where variable doping results with higher resistance in the steeper areas than the flat areas, plus heavy doping formed in contact areas by doping through openings in a contact mask.

U.S. Pat. No. 4,643,777 of Maeda for "Method of Manufacturing a Semiconductor Device Comprising Resistors of High and Low Resistances" describes a method of forming resistors in portions of a polysilicon layer with portions covered with a mask and the other portions covered with a molybdenum film. Then the molybdenum film is subjected to a silicifying step. The result is that those regions of the polysilicon film located under the molybdenum film have a low resistance, while the regions of the polysilicon film covered by the mask have a high resistance value.

See U.S. Pat. No. 5,622,884 of Liu for "Method for Manufacturing a Semiconductor Memory Cell and a Polysilicon Load Resistor of the Semiconductor Memory Cell" describe a load resistor formed by depositing a polysilicon layer over an insulating layer. The polysilicon layer is ion implanted with dopant and is then masked and etched to form a high resistance load resistor.

In the past, in order to form polysilicon layers with a different resistance in an integrated circuit, the solution has been to modify the area and length of the polysilicon to meet the criteria required. However, that approach increases the cost of manufacturing due to the complex process.

SUMMARY OF THE INVENTION

In accordance with this invention a device with a plurality of structures with different resistance values includes as follows:

a polysilicon layer upon a substrate, a hard masking layer formed upon the polysilicon layer, the hard masking layer including a full thickness portion and a lower thickness portion, and the polysilicon layer having a high resistance beneath the full thickness portion and a low resistance beneath the low thickness portion.

The hard masking layer is composed of a material selected from the group consisting of silicon oxide and silicon nitride.

The full thickness portion is from about 0.3 $\mu$m to about 0.5 $\mu$m thick, and the lower thickness portion is from about 0.01 $\mu$m to about 0.15 $\mu$m thick.

The polysilicon layer is formed over a silicon oxide layer selected from a field oxide layer and a gate oxide layer.

BRIEF DESCRIPTION OF THE DRAWINGS

The foregoing and other aspects and advantages of this invention are explained and described below with reference to the accompanying drawings, in which.

DESCRIPTION OF PREFERRED EMBODIMENTS

The object of the method of this invention is to produce a set of high and low resistance polysilicon structures in an integrated circuit device.

There are numerous alternative sequences of processing steps which can be performed to produce the result seen in FIG. 1G.

First Embodiment of the Invention

Figure 1:
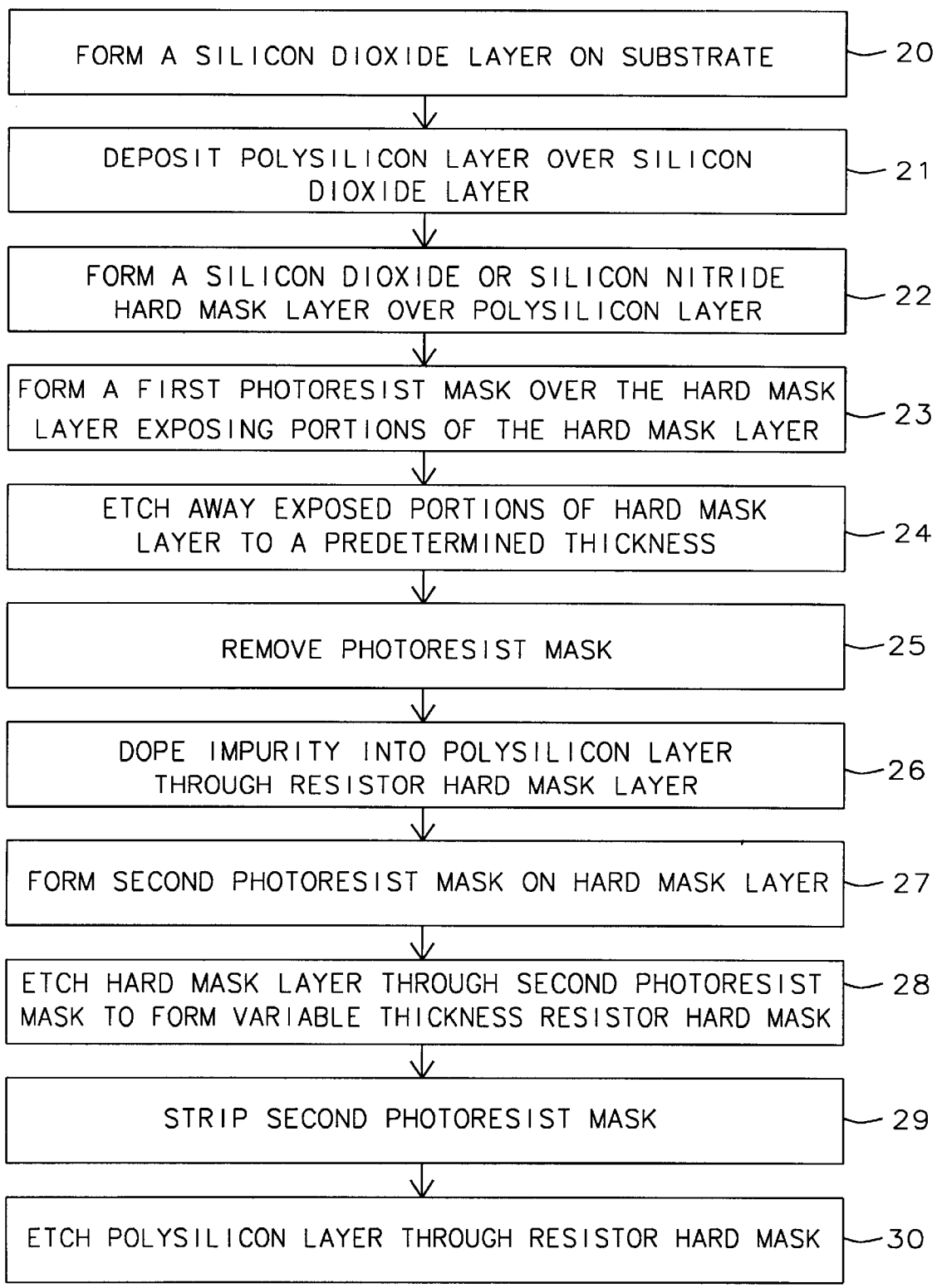
FIG. 1 shows a flow chart of processing steps in accordance with a first embodiment of this invention.
Figure 2A:
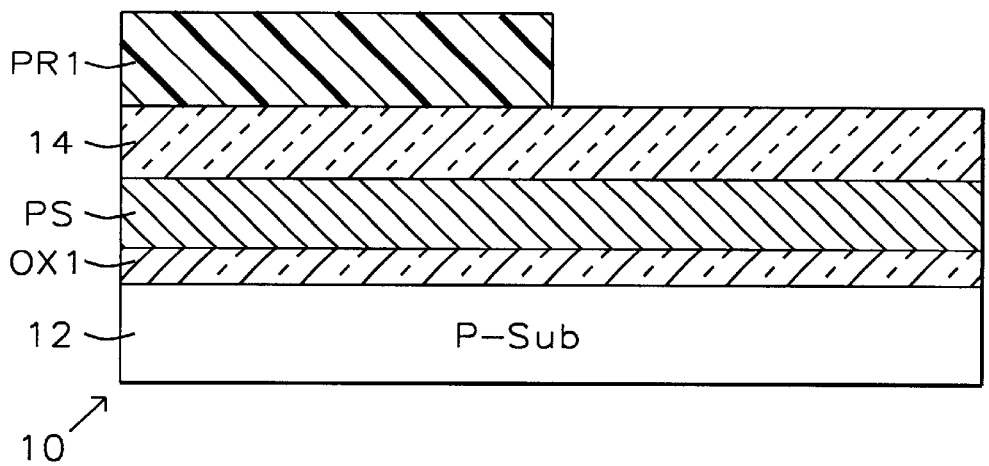
FIGS. 2A–2H illustrate a device in the process of manufacture which forms a single polysilicon layer PS into structures with different resistance values in accordance with the process of FIG. 1.

Referring to FIG. 1 and FIGS. 2A–2H, a method of forming a single polysilicon layer PS into structures with different resistance values, comprises the steps as follows:

(1) Referring to FIG. 1 in step 20, and FIG. 2A an integrated circuit device 10 is made starting with a substrate 12, such as a P-doped substrate. During this first step, the substrate 12 is coated with a silicon dioxide ($SiO_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 21 deposit a polysilicon layer PS over the silicon dioxide layer OX1 for a resistor or capacitor plate.

(3) In step 22, form a hard mask layer 14 of silicon dioxide ($SiO_2$) or silicon nitride ($Si_3N_4$) on the polysilicon layer PS with a thickness from about 0.3 μm to about 0.5 μm.

(4) Then, in step 23 define a first photoresist mask PR1 over hard mask layer 14 to produce a surface area of the exposed region of the hard mask layer 14 by leaving portions of the hard mask layer exposed, i.e. without protection by first photoresist mask PR1.

Figure 2B:
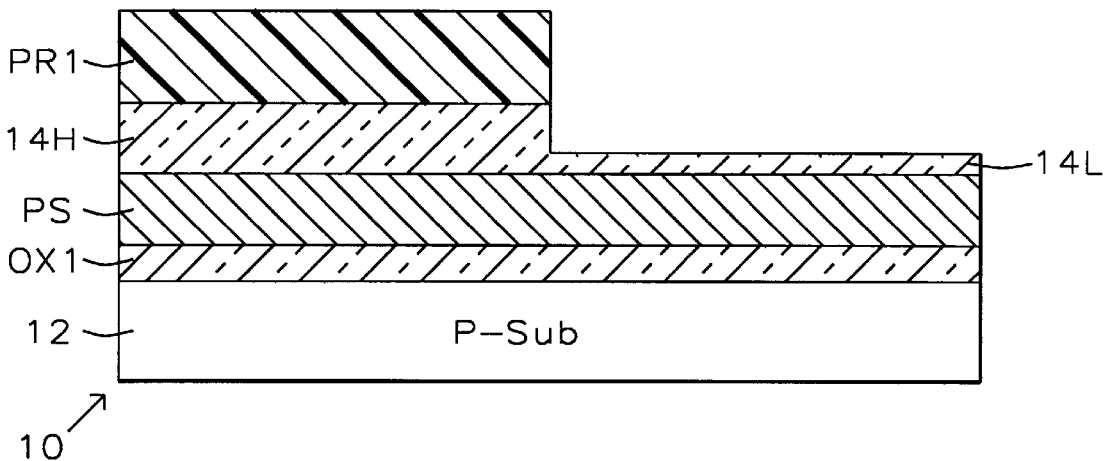

(5) Referring to FIG. 2B, in step 24 of FIG. 1, etch away a substantial thickness of the hard mask layer 14 in the exposed area referred to hereinafter as the "low resistance" thin region 14L which has been reduced to a predetermined thickness from about 0.01 μm to about 0.15 μm in the exposed area referred to hereinafter as thin region 14L.

The remainder of hard mask layer 14 comprises the "high resistance" thick region 14H of polysilicon layer 14 with its original thickness.

Figure 2C:
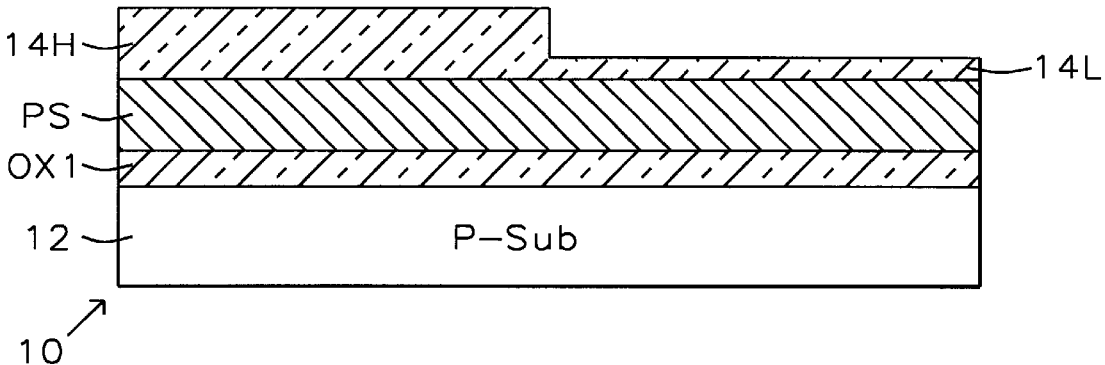

(6) Referring to FIG. 2C, in step 25, remove the photoresist mask PR1 leaving the thick region 14H of hard mask layer 14, as well as the thin region 14L, exposed.

Figure 2D:
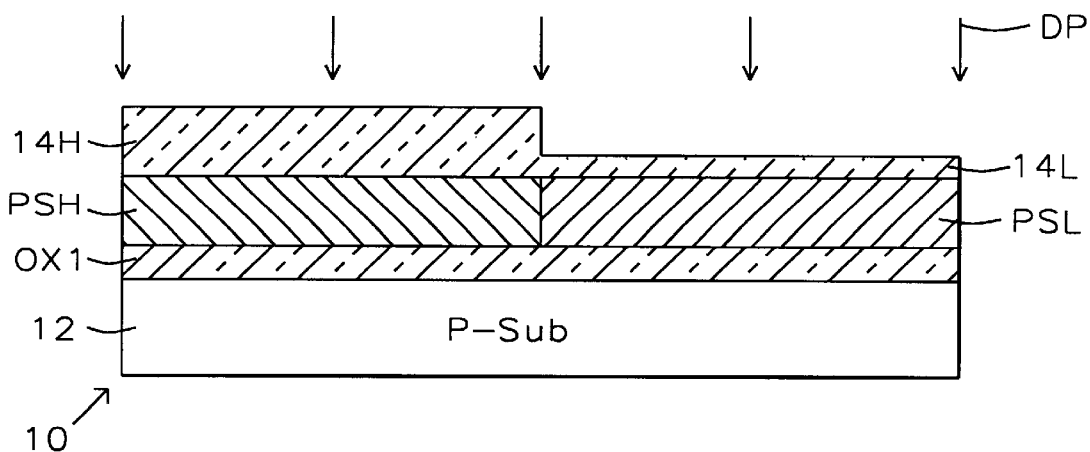

(7) Referring to FIG. 2D, in step 26 dope or ion implant an impurity DP into polysilicon layer PS through the hard mask thick region 14H and the thin region 14L of silicon dioxide ($SiO_2$) or silicon nitride ($Si_3N_4$) to produce high resistance region PSH of layer PS under thick region 14H and low resistance region PSL of layer PS under thin region 14L.

The doping can be provided by ion implanting with a dose of N type or P type dopant from about $1\ E\ 12$ ions/cm$^2$ to about $1\ E\ 15$ ions/cm$^2$ at an energy from about 30 keV to about 120 keV.

After annealing the concentration of N-type or P-type dopant in the high resistance region PSH was from about $1\ E\ 12$ atoms/cm$^3$ to about $1\ E\ 15$ atoms/cm$^3$.

The concentration of N-type or P-type dopant in the low resistance region PSL was from about $1\ E\ 12$ atoms/cm$^3$ to about $1\ E\ 15$ atoms/cm$^3$.

Figure 2E:
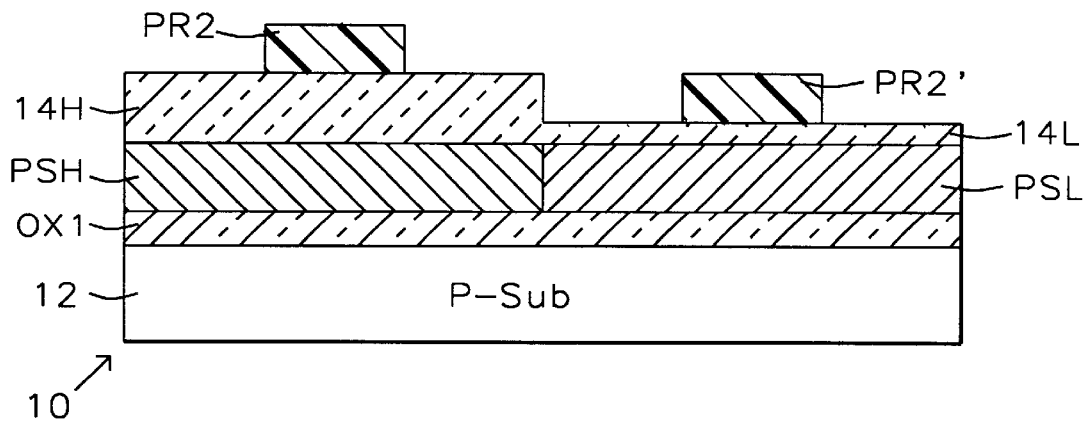

(8) Referring to FIG. 2E, in step 27 form a second mask PR2/PR2' (formed of photoresist) for patterning the hard mask layer thick region 14H and the hard mask thin region 14L (silicon dioxide or silicon nitride) using photolithography and etching only.

Figure 2F:
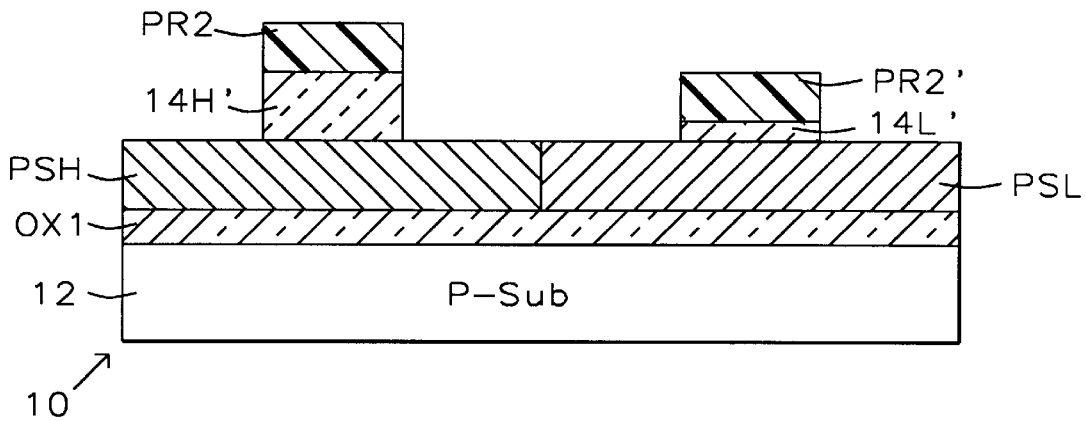

(b 9) Referring to FIG. 2F, noting that the photoresist mask PR2 is spaced away from the photoresist mask PR2', in step 28, hard mask layer 14 was patterned into a separate full thickness hard mask 14H' under photoresist mask PR2 which is spaced away from a separate thin hard mask 14L' under photoresist mask PR2'.

Figure 2G:
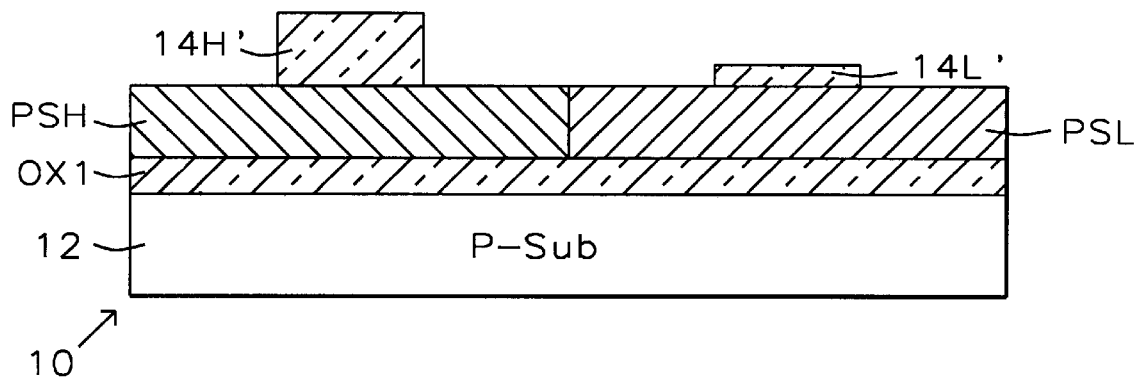

(10) Then, referring to FIG. 2G, in step 29 the photoresist masks PR2/PR2' were stripped from the hard masks 14H' and 14L'.

Figure 2H:
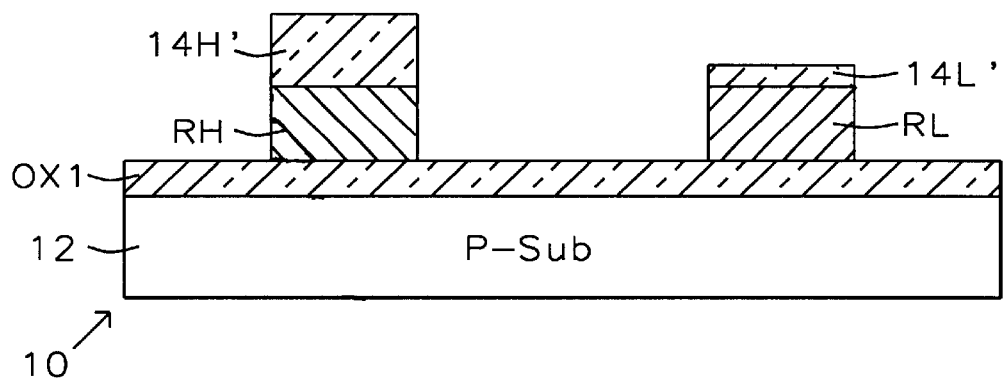

(11) Then, referring to FIG. 2H, in step 30 the thick hard mask 14H' and the thin hard mask 14L' (which is spaced away from the thick hard mask 14H') were used to pattern polysilicon regions PSH and PSL using highly selective etching to form the high resistance device RH from region PSH, under thick hard mask 14H' and the low resistance device RL from region PSL, under thin hard mask 14L'.

Second Embodiment of the Invention

Figure 3:
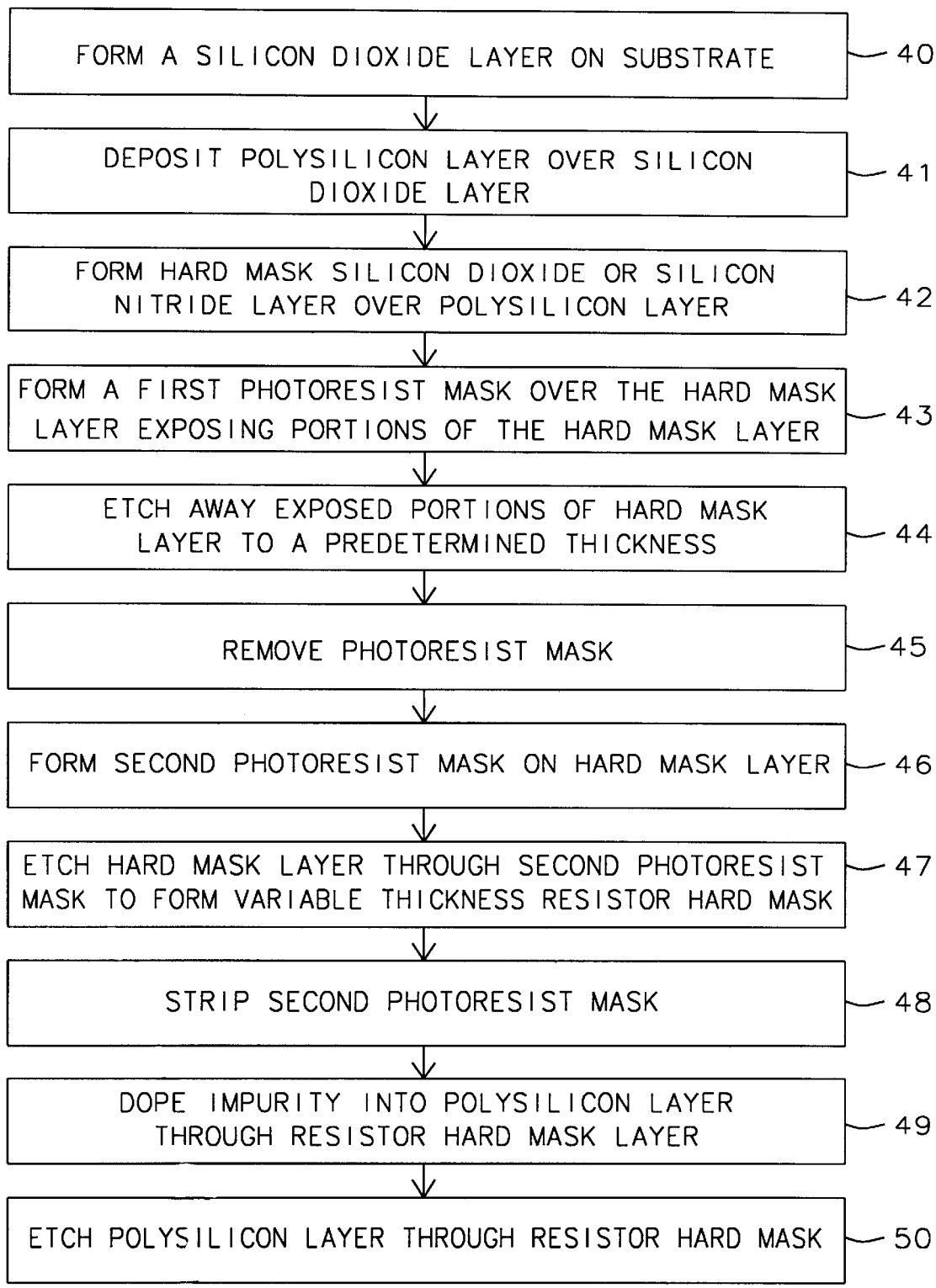
FIG. 3 shows a flow chart of processing steps in accordance with a second embodiment of this invention.
Figure 4A:
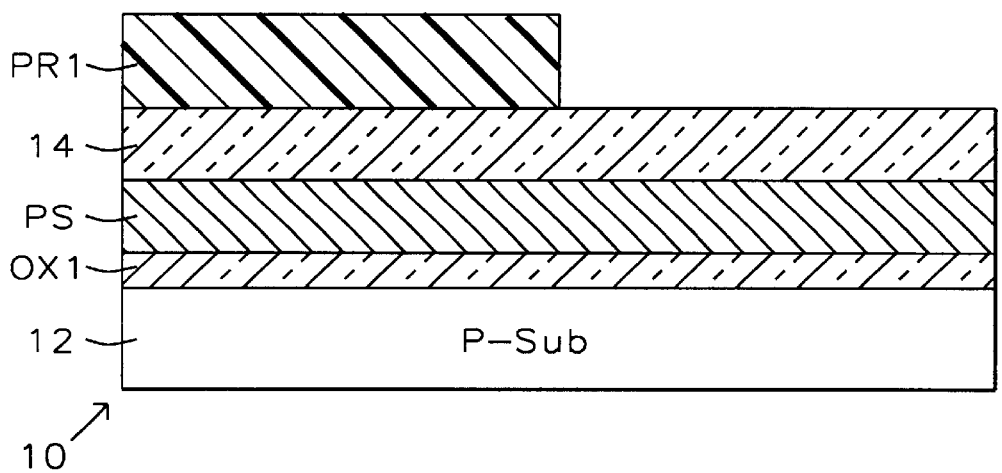
FIGS. 4A–4H illustrate a device in the process of manufacture which forms a single polysilicon layer into structures with different resistance values in accordance with the process of FIG. 3.
Figure 6A:
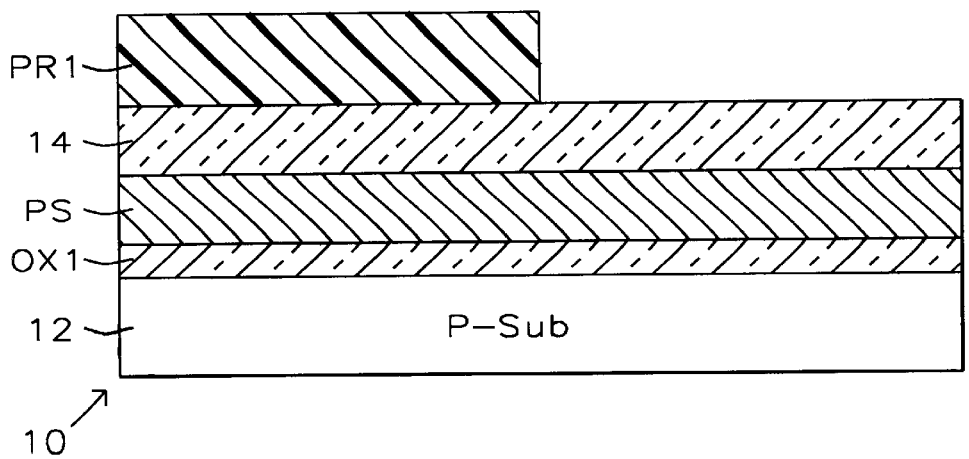
FIGS. 6A–6H illustrate a device in the process of manufacture which forms a single polysilicon layer into structures with different resistance values in accordance with the process of FIG. 5.
Figure 6B:
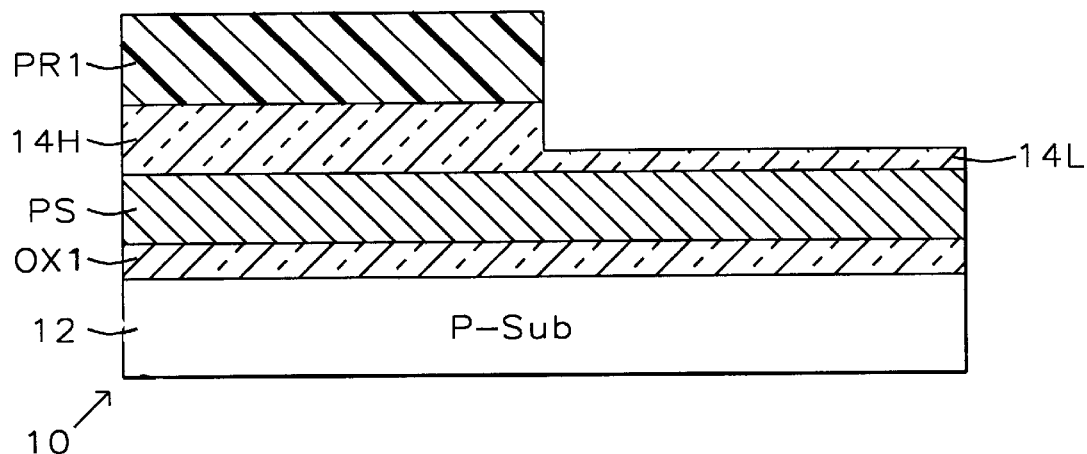
Figure 6C:
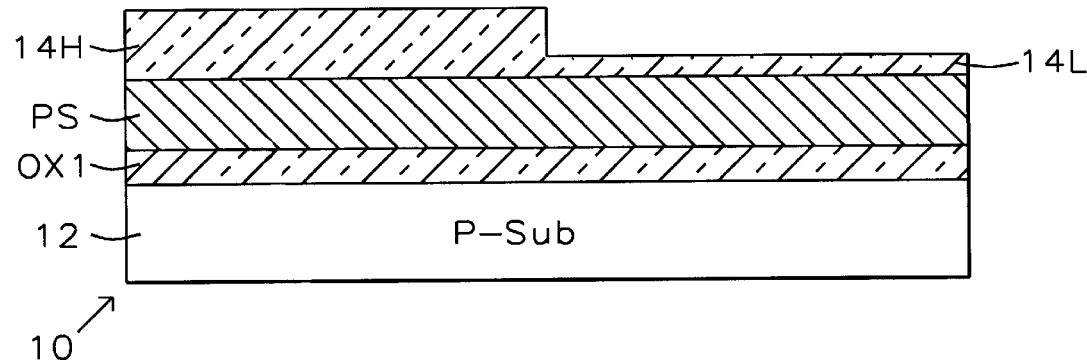
Figure 6D:
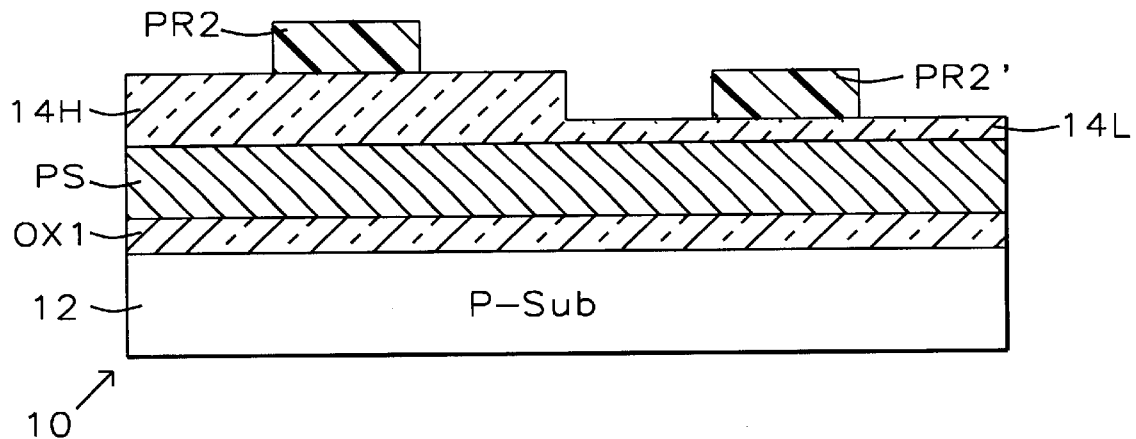
Figure 6E:
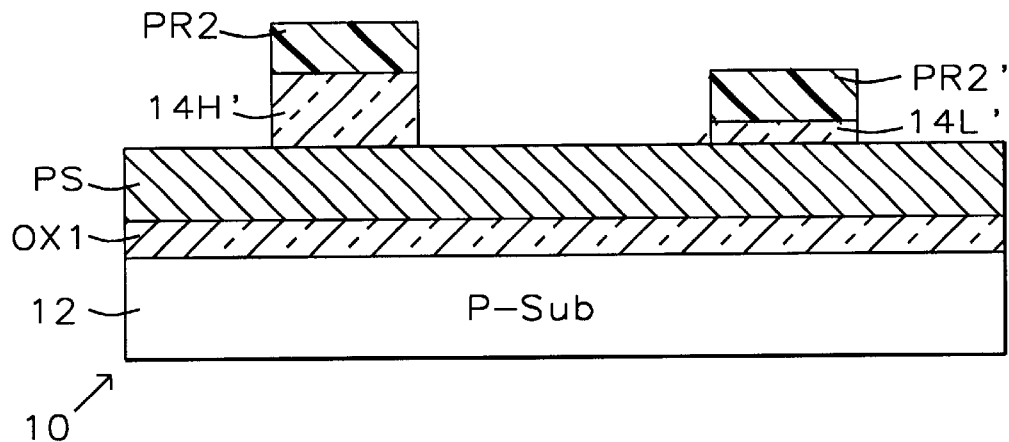
Figure 6F:
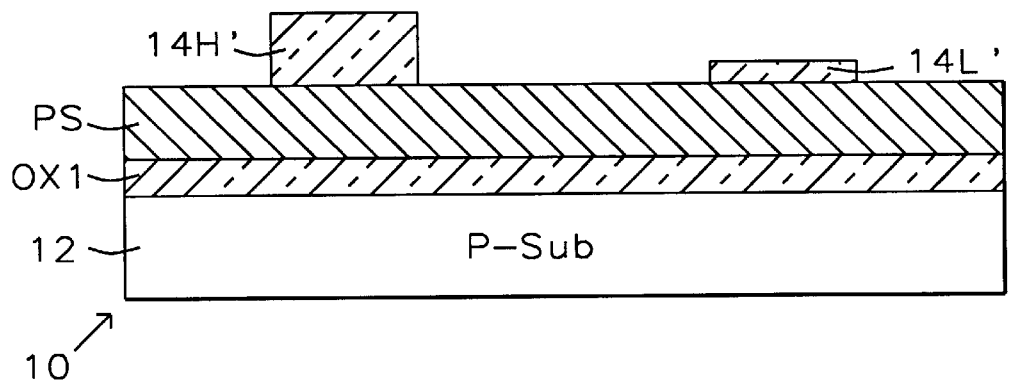
Figure 6G:
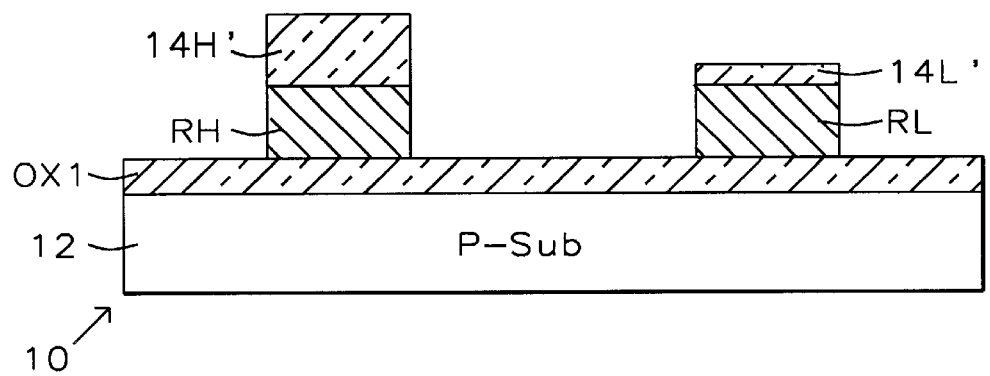
Figure 6H:
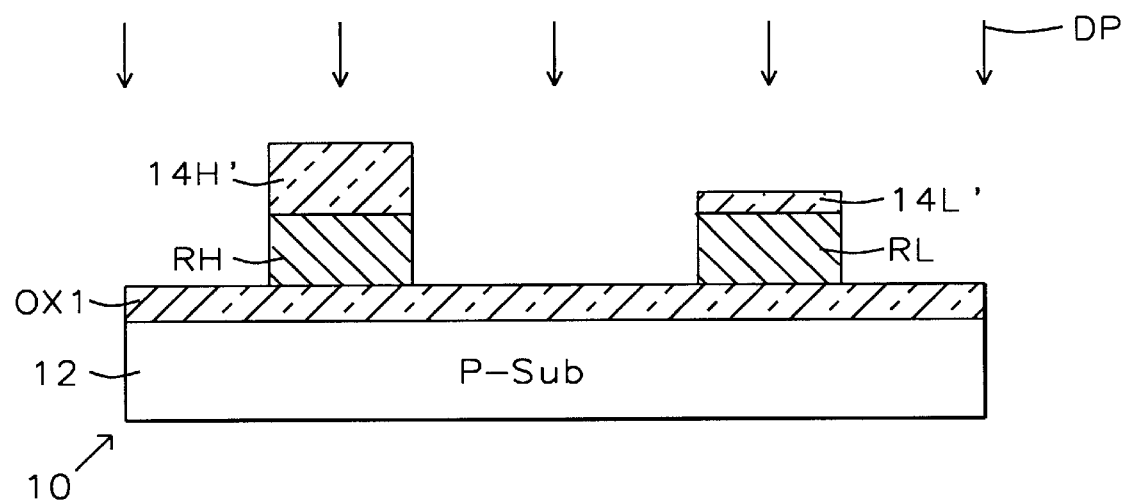

The method of the second embodiment of the invention is similar to the method of the first embodiment except that the steps are as shown in FIGS. 2A–2H with the doping step moved from FIG. 2D in the first embodiment to FIG. 6H in the first embodiment representing a switch in the sequence of processing of the doping step to nearer the end of the process. The method of the second embodiment is as follows:

(1) Referring to FIGS. 3 and 4A the device 10 described above is made by a different sequence of the above steps, starting with step 40 in FIG. 3 with reference to FIG. 4A. The integrated circuit device 10 is made starting with a substrate 12, such as a P-doped substrate. During this first step 40, the substrate 12 is coated with a silicon dioxide ($SiO_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 41 deposit a polysilicon layer PS over the silicon dioxide layer OX1 for a resistor or capacitor plate.

(3) In step 42, form a hard mask layer 14 of silicon dioxide ($SiO_2$) or silicon nitride ($Si_3N_4$) on the polysilicon layer PS with a thickness from about 0.3 μm to about 0.5 μm.

(4) Then, in step 43 define a first photoresist mask PR1 over layer 14 to produce a surface area of the exposed region of the hard mask layer 14 by leaving it without coverage by first photoresist mask PR1.

Figure 4B:
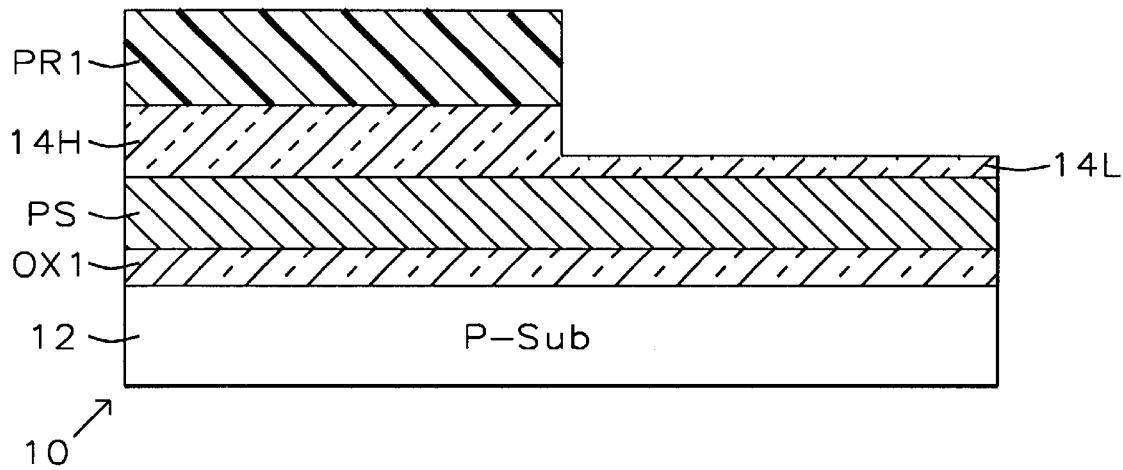

(5) Referring to FIG. 4B, in step 44 of FIG. 3, etch away a substantial thickness of the hard mask layer 14 in the exposed area referred to hereinafter as the "low resistance" thin region 14L which has a reduced, predetermined thickness from about 0.01 μm to about 0.15 μm.

The remainder of hard mask layer 14 comprises the "high resistance", thick region 14H of polysilicon layer 14 with its original thickness.

Figure 4C:
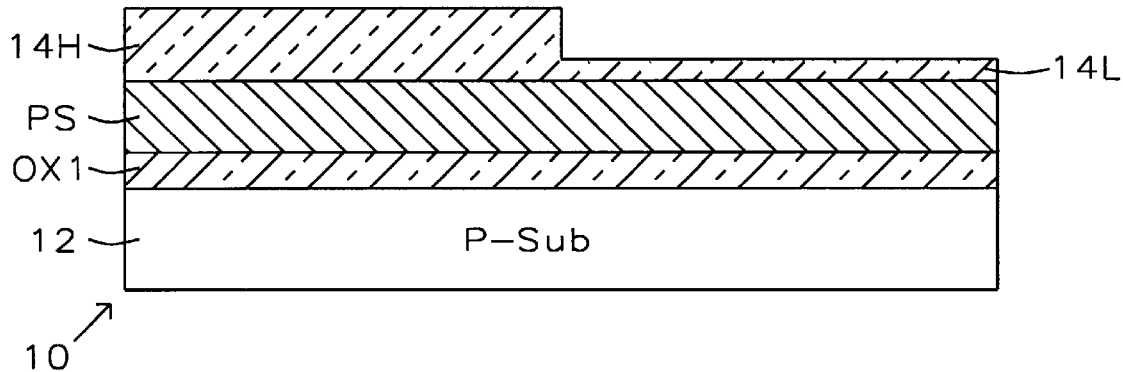

(6) Referring to FIG. 4C, in step 45, remove the photoresist mask PR1 leaving the thick region 14H of hard mask layer 14, as well as thin region 14L, exposed.

Figure 4D:
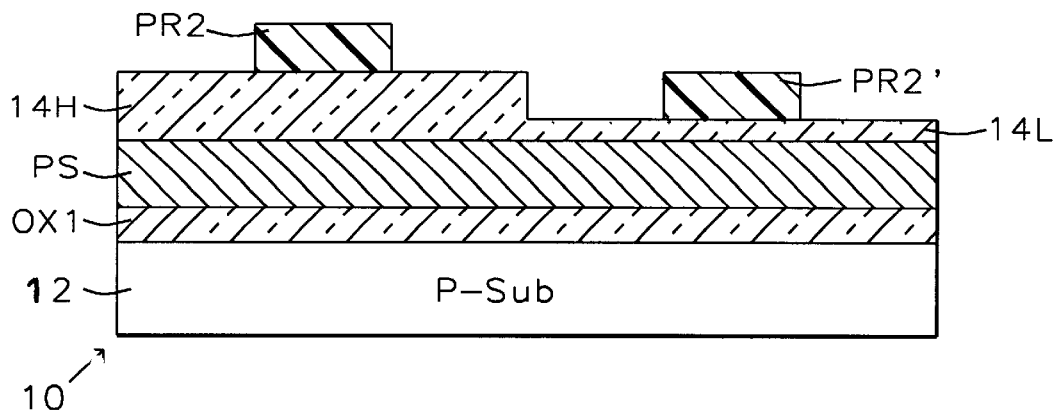

(7) Referring to FIG. 4D, in step 46, form a second mask PR2/PR2' (formed of photoresist) for patterning the hard mask layer thick region 14H and the hard mask thin region 14L (silicon dioxide or silicon nitride) using photolithography and etching only.

Figure 4E:
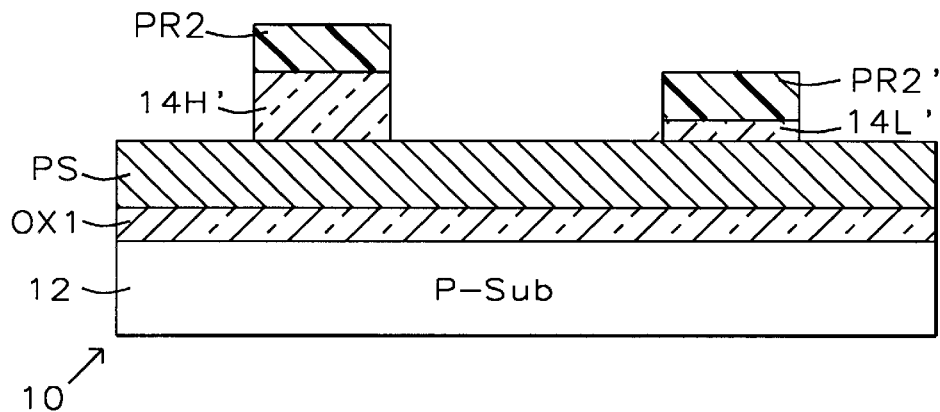

(8) Referring to FIG. 4E, in step 47, hard mask layer 14 has been patterned into separate thick hard mask 14H' under photoresist mask PR2 and thin hard mask 14L' under photoresist mask PR2'.

Figure 4F:
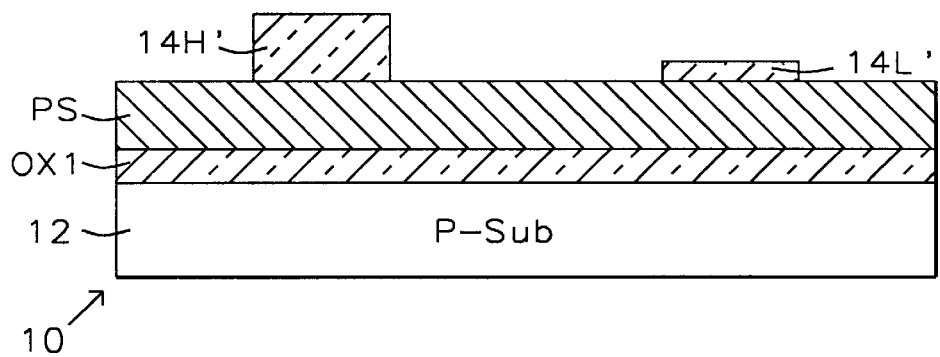

(9) Then, referring to FIG. 4F, in step 48 the photoresist masks PR2/PR2' were stripped from the thick and thin hard mask layers 14H' and 14L', respectively.

Figure 4G:
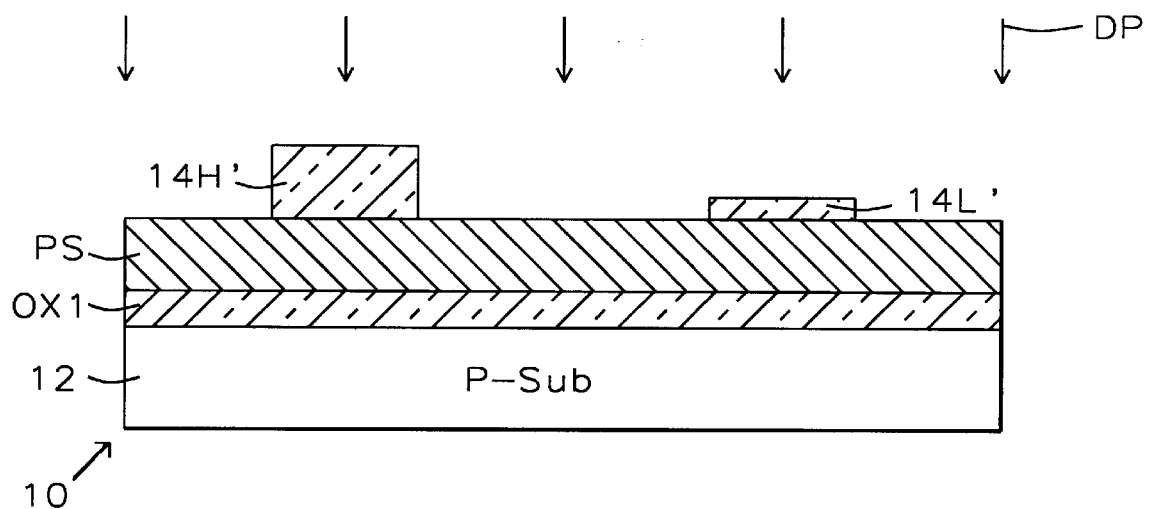

(10) Referring to FIG. 4G, in step 49 dope or ion implant an impurity DP into polysilicon layer PS through hard mask layer 14 of silicon dioxide ($SiO_2$) or silicon nitride ($Si_3N_4$).

The doping can be provided by ion implanting with a dose of N-type or P-type dopant from about $1\ E\ 12$ ions/cm$^2$ to about $1\ E\ 15$ ions/cm$^2$ at an energy from about 30 keV to about 120 keV.

After annealing the concentration of N-type or P-type dopant in the high resistance region RH was from about $1\ E\ 12$ atoms/cm$^3$ to about $1\ E\ 15$ atoms/cm$^3$. The concentration of N-type or P-type dopant in the low resistance region RL was from about $1\ E\ 12$ atoms/cm$^3$ to about $1\ E\ 15$ atoms/cm$^3$.

Figure 4H:
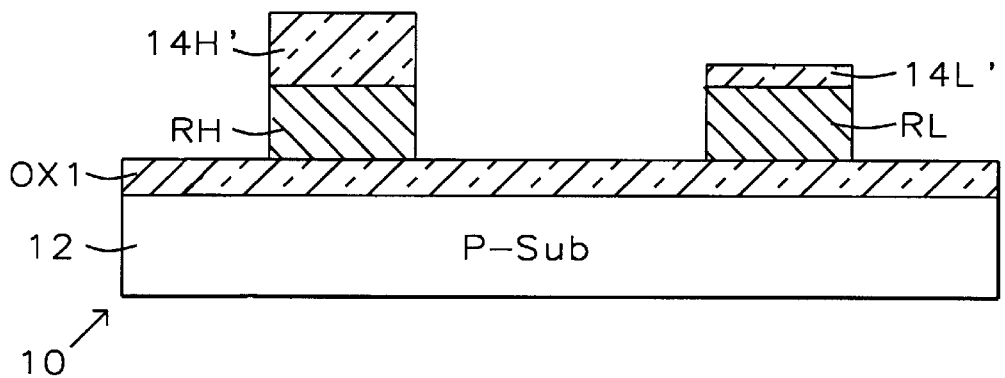

(11) Referring to FIG. 4H, use the thick hard mask 14H' under mask PR2 and thin hard mask 14L' to pattern polysilicon using highly selective etching.

Third Embodiment of the Invention

Figure 5:
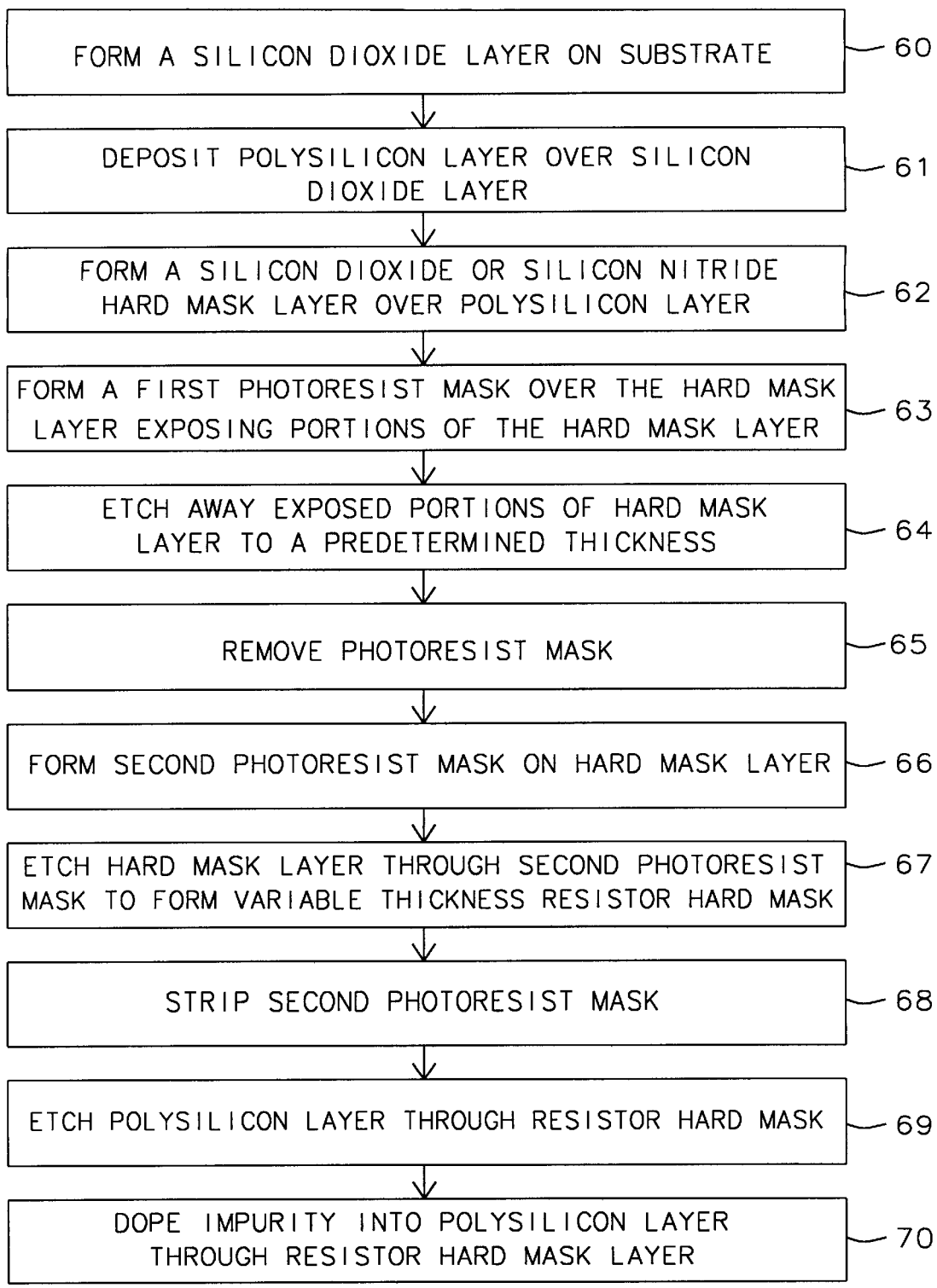
FIG. 5 shows a flow chart of processing steps in accordance with a third embodiment of this invention.

The method of the third embodiment of the invention is similar to the method of the second embodiment except that the steps are as shown in FIGS. 6A–6H with FIGS. 6G and 6H representing a reversal of the processing of the doping step. The method of the third embodiment is as follows:

(1) Referring to FIGS. 5 and 6A, the device 10 described above is made by a different sequence of the above steps, starting with step 60 in FIG. 3 with reference to FIG. 6A. The integrated circuit device 10 is made starting with a substrate 12, such as a P-doped substrate. During this first step 60, the substrate 12 is coated with a silicon dioxide ($SiO_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 41 deposit a polysilicon layer PS over the silicon dioxide layer OX1 for a resistor or capacitor plate.

(3) In step 62, form a hard mask layer 14 of silicon dioxide ($SiO_2$) or silicon nitride ($Si_3N_4$) on the polysilicon layer PS with a thickness from about 0.3 μm to about 0.5 μm.

(4) Then, in step 63 define a first photoresist mask PR1 over layer 14 to produce a surface area of the exposed region of the hard mask layer 14 by leaving it without coverage by first photoresist mask PR1.

(5) Referring to FIG. 6B, in step 64 of FIG. 5, etch away a substantial thickness of the hard mask layer 14 leaving an exposed area referred to hereinafter as the "low resistance", thin region 14L which has a reduced, predetermined thickness, from about 0.01 μm to about 0.15 μm.

The remainder of hard mask layer 14 comprises the thick, "high resistance", thick region 14H of polysilicon layer 14 with its original thickness.

(6) Referring to FIG. 6C, in step 65, remove the photoresist mask PR1 leaving the thick region 14H of hard mask layer 14, as well as thin region 14L, exposed.

(7) Referring to FIG. 6D, in step 66, form a second mask PR2/PR2' (formed of photoresist) for patterning the hard mask layer thick region 14H and the hard mask thin region 14L (silicon dioxide or silicon nitride) using photolithography and etching only.

(8) Referring to FIG. 6E, in step 67, hard mask layer 14 has been patterned into a separate thick hard mask 14H' under photoresist mask PR2 and into a separate thin hard mask 14L' under photoresist mask PR2'.

(9) Then, referring to FIG. 6F, in step 68 the photoresist masks PR2/PR2' were stripped from both the thick and the thin hard mask layers 14H' and 14L', respectively.

At this point the process diverges from FIGS. 4G and 4H to the steps as illustrated by FIGS. 6G and 6H.

(10) Referring to FIG. 6G, in step 69, use the thick hard mask 14H' under mask PR2 and thin hard mask 14L' to pattern the polysilicon layer PS into a high resistance device RH and low resistance device RL using highly selective etching.

(11) Referring to FIG. 6H, in step 70, dope or ion implant an impurity DP into polysilicon layer PS through hard mask layer 14 of silicon dioxide ($SiO_2$) or silicon nitride ($Si_3N_4$).

The doping of the polysilicon layer can be provided by ion implanting with a dose of N-type or P-type dopant from about 1 E 12 ions/$cm^2$ to about 1 E 15 ions/$cm^2$ at an energy from about 30 keV to about 120 keV.

After annealing the concentration of N-type or P-type dopant in the high resistance region RH was from about 1 E 12 atoms/$cm^3$ to about 1 E 15 atoms/$cm^3$. The concentration of N-type or P-type dopant in the low resistance region RL was from about 1 E 12 atoms/$cm^3$ to about 1 E 15 atoms/$cm^3$.

In summary, the three embodiments described above provide as follows:

1. Doping polysilicon after etching the hard mask pattern to variable thicknesses.

2. Etching the hard mask pattern to variable thicknesses followed by patterning the hard mask and then patterning the polysilicon and doping after using the hard mask in step 10.

3. Etching the hard mask pattern to variable thicknesses followed by patterning the hard mask and patterning the polysilicon followed by doping of the polysilicon in step 11.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A device with a plurality of structures with different resistance values comprising:

a silicon oxide layer formed over the substrate, a polysilicon layer formed over the silicon oxide layer, a hard masking layer formed upon the polysilicon layer, the hard masking layer including a full thickness portion of the hard masking layer and a thinner portion of the hard masking layer, the polysilicon layer having a lightly doped high resistance region with N-type or P-type dopant located beneath the full thickness portion of the hard masking layer, the polysilicon layer having a heavily doped low resistance region with N-type or P-type dopant located beneath the thinner portion of the hard masking layer, and with the high resistance region of the polysilicon layer and the low resistance region of the polysilicon layer having the same thickness and the same dopant type.

2. The device of claim 1 wherein the hard masking layer is composed of a material selected from the group consisting of silicon oxide and silicon nitride.

3. The device of claim 2 wherein:

the full thickness portion of the hard masking layer is from about 0.3 μm to about 0.5 μm thick, and the thinner portion of the hard masking layer is from about 0.01 μm to about 0.15 μm thick.

4. The device of claim 1 wherein:

the full thickness portion of the hard masking layer is from about 0.3 μm to about 0.5 μm thick, and the thinner portion of the hard masking layer is from about 0.01 μm to about 0.15 μm thick.

5. The device of claim 1 wherein the polysilicon layer is formed over the silicon oxide layer which is composed of a material selected from the group consisting of a field oxide layer and a gate oxide layer.

6. A device with a plurality of structures with different resistance values comprising:

a silicon oxide layer formed over the substrate, a polysilicon layer formed over the silicon oxide layer, a hard masking layer formed upon the polysilicon layer with the hard masking layer having been etched to include a full thickness portion of the hard masking layer and a thinner portion of the hard masking layer, with the full thickness portion of the hard masking layer being spaced away from the thinner portion of the hard masking layer, the polysilicon layer having a lightly doped high resistance region with N-type or P-type dopant located beneath the full thickness portion of the hard masking layer, the polysilicon layer having a heavily doped low resistance region with N-type or P-type dopant located beneath the thinner portion of the hard masking layer, and with the high resistance region of the polysilicon layer and the low resistance region of the polysilicon layer having the same thickness and the same dopant type.

7. A device with a capacitor plate and a resistor formed thereon comprising:

a field oxide adapted for use with a capacitor plate, a polysilicon layer formed upon the field oxide, the hard masking layer formed upon the polysilicon layer, the hard masking layer having been etched to include a full thickness portion of the hard masking layer and a thinner portion of the hard masking layer, the polysilicon layer having a lightly doped high resistance region with N-type or P-type dopant located beneath the full thickness portion of the hard masking layer, the polysilicon layer having a heavily doped low resistance region with N-type or P-type dopant located beneath the thinner portion of the hard masking layer, and with the high resistance region of the polysilicon layer and the low resistance region of the polysilicon layer having the same thickness and the same dopant type.

8. The device of claim 7 wherein the hard masking layer is composed of a material selected from the group consisting of silicon oxide and silicon nitride.

9. The device of claim 8 wherein:

the full thickness portion of the hard masking layer is from about 0.3 $\mu$m to about 0.5 $\mu$m thick, and the thinner portion of the hard masking layer is from about 0.01 $\mu$m to about 0.15 $\mu$m thick.

10. The device of claim 7 wherein:

the full thickness portion of the hard masking layer is from about 0.3 $\mu$m to about 0.5 $\mu$m thick, and the thinner portion of the hard masking layer is from about 0.01 $\mu$m to about 0.15 $\mu$m thick.

11. The device of claim 7 wherein the full thickness portion of the hard masking layer is spaced away from the thinner portion of the hard masking layer.

12. A device with a plurality of structures with different resistance values comprising:

a silicon dioxide layer for a structure selected from the group consisting of a field oxide for a capacitor plate or a resistor and a gate oxide for a capacitor or a gate electrode, a polysilicon layer formed upon the silicon dioxide layer, a hard masking layer formed upon the polysilicon layer, the hard masking layer having been etched to include a full thickness portion of the hard masking layer and a thinner portion of the hard masking layer spaced away from the full thickness portion of the hard masking layer, the polysilicon layer having a lightly doped high resistance region with N-type or P-type dopant in the high resistance region located beneath the full thickness portion of the hard masking layer, the polysilicon layer having a heavily doped low resistance region, with N-type or P-type dopant in the low resistance region located beneath the thinner portion of the hard masking layer, and with the high resistance region and the low resistance region of the polysilicon layer having the same thickness and the same dopant type.

13. The device of claim 12 wherein the hard masking layer is composed of a material selected from the group consisting of silicon oxide and silicon nitride.

14. The device of claim 13 wherein:

the full thickness portion of the hard masking layer is from about 0.3 $\mu$m to about 0.5 $\mu$m thick, and the thinner portion of the hard masking layer is from about 0.01 $\mu$m to about 0.15 $\mu$m thick.

15. The device of claim 12 wherein:

the full thickness portion of the hard masking layer is from about 0.3 $\mu$m to about 0.5 $\mu$m thick, and the thinner portion of the hard masking layer is from about 0.01 $\mu$m to about 0.15 $\mu$m thick.

16. The device of claim 12 wherein the full thickness portion of the hard masking layer is spaced away from the thinner portion of the hard masking layer.

17. A device with a plurality of structures with different resistance values comprising:

a silicon oxide layer formed on a substrate, said silicon oxide layer being selected from the group consisting of a gate oxide and a field oxide, the silicon oxide layer being adapted for use with a capacitor, a polysilicon layer formed on the silicon oxide layer, a hard masking layer formed upon the polysilicon layer, the hard masking layer having been etched to include a full thickness portion of the hard masking layer and a thinner portion of the hard masking layer, the polysilicon layer having a lightly doped high resistance region with N-type or P-type dopant located beneath the full thickness portion of the hard masking layer, the polysilicon layer having a heavily doped low resistance region with N-type or P-type dopant beneath the thinner portion of the hard masking layer, and with the high resistance region of the polysilicon layer and the low resistance region of the polysilicon layer having the same thickness and the same dopant type.

18. The device of claim 17 wherein the hard masking layer is composed of a material selected from the group consisting of silicon oxide and silicon nitride.

19. The device of claim 18 wherein:

the full thickness portion of the hard masking layer is from about 0.3 $\mu$m to about 0.5 $\mu$m thick, and the thinner portion of the hard masking layer is from about 0.01 $\mu$m to about 0.15 $\mu$m thick.

20. The device of claim 17 wherein:

the full thickness portion of the hard masking layer is from about 0.3 $\mu$m to about 0.5 $\mu$m thick, and the thinner portion of the hard masking layer is from about 0.01 $\mu$m to about 0.15 $\mu$m thick.

21. The device of claim 17 wherein the full thickness portion of the hard masking layer is spaced away from the thinner portion of the hard masking layer.

* * * * *